METHOD OF MOUNTING A SEMICONDUCTOR DEVICE

Filed Aug. 29, 1958

INVENTORS
JOSEPH SHELLICK &
JEROME E. WRIGHT

BY

J. L. Whittaker
ATTORNEY 3,109,225

METHOD OF MOUNTING A SEMICONDUCTOR DEVICE

Jerome E. Wright, Glen Lyon, Pa., and Joseph Shellick, Manville, N.J., assignors to Radio Corporation of America, a corporation of Delaware Filed Aug. 29, 1958, Ser. No. 758,090
10 Claims. (Cl. 29—155.5)

This invention relates to improved semiconductor devices, and to improved methods of fabricating them. More particularly, the invention relates to an improved method of providing thermal dissipation in PN junction-type semiconductor devices used in power applications.

An important class of semiconductor devices, known as transistors, usually comprises a semicondutive body having three regions or zones of different conductivity-type separated by two PN junctions. The zones may be arranged in PNP or NPN order. Such devices with regions of alternate conductivity type separated by rectifying barriers may be formed by several methods. One of these methods is the surface alloy process, in which two pellets that induce conductivity of given type are positioned on opposing surfaces of a monocrystalline semiconductive wafer of the opposite conductivity type. The assembly is then heated so that the pellets melt and dissolve some of the wafer material. Upon cooling, the dissolved wafer material recrystallizes in the original semiconductor lattice, but contains sufficient pellet material to form a zone of the given conductivity type. At the interface between each recrystallized given conductivity type zone and the unchanged opposite conductivity type bulk of the wafer, a rectifying barrier is formed. The fused pellets become device electrodes.

In surface alloyed transistors one of the two recrystallized regions is operated as the emitter, while the other region is operated as the collector. An ohmic nonrectifying contact is made to the bulk of the wafer, which constitutes the base region of the device. When an input signal is applied between the emitter and base electrodes, the emitter region injects minority carriers into the base region. Minority carriers in a semiconductor are charge carriers of type opposite to the conductivity type of the semiconductor. In a PNP transistor the base region is the N region, hence while the majority carriers in the base are N-type, the minority carriers in the base region are P-type defect electrons or holes. In an NPN transistor the minority carriers are N-type, i.e., electrons. The minority carriers are injected at low impedance, diffused through the base region, and are collected at high impedance by the collector electrode, thereby producing power gain.

The operation of semiconductor devices generates unwanted heat. As in most electrical devices, the more power handled, the more heat generated. In devices of the transistor type which contain respectively an emitter region, a rectifying barrier known as the emitter junction, a base region, a rectifying barrier known as the collector junction, and a collector region, most of the heat is generated in the collector region. The generated heat must be dissipated, since otherwise the temperature of the device rises to a level at which the thermal energy elevates electrons across the energy gap from the valence band to the conduction band, so that the device is no longer operative. In most cases, temperatures above 100° C. change the nature of the semiconductor surface, so that the current gain is markedly decreased even before the temperature is attained at which thermal energy renders the device inoperative. It is desirable to keep the operating temperature of a transistor close to ambient temperature to simplify circuit stabilization. The dissipation of the generated heat is particularly important in the operation of power transistors, as the power handling capabilities of such devices depends on their rate of cooling. Transistors in which the semiconductor wafer is germanium are generally not operative above about 100° C. Excessive heating may permanently injure or completely destroy semiconductor devices.

Various methods have been employed to dissipate the heat generated by semiconductive devices. For example, one solution of the problem of heat dissipation has been to immerse the semiconductor device in a metallic container filled with an oil or other liquid. However, the liquids generally used have been unsatisfactory because they do not provide sufficient heat dissipation, and because they often impair the electrical characteristics of the device by adversely affecting the surface of the semiconductor crystal.

A different method has been used for dissipating heat from devices such as alloy junction power transistors. The transistors have been bonded to heat dissipators, or heat sinks, which are usually comparatively large metallic bodies that absorb the heat generated by the device. The heat dissipator transfers the adsorbed heat to the chassis, or directly to the atmosphere, which is the ultimate heat sink. A serious difficulty in this method has been the production of a low-thermal-resistance connection between the device and the metallic body which absorbs and transfers the heat. One solution of this problem utilizes an indium-to-indium cold pressure weld between the heat sink and the alloyed indium collector electrode. However, this technique is not applicable to surface alloyed transistors in which the electrode pellets are made of materials other than indium. For example, in NPN units the electrode pellets consist predominantly of lead, with small amounts of donors such as arsenic or antimony. Such pellets cannot be coated with indium, since the indium forms a mechanically weak bond with lead, and furthermore acts as an acceptor to disturb the electrical characteristics of the device. Other electrode pellet materials such as aluminum are also incapable of forming a strong bond with indium.

Attempts have been made to mount such transistors on a metallic heat sink, such a copper support, by soldering an electrode directly to the support. However, this approach has not been satisfactory, since soldering flux and other undesirable materials are thereby spread around the electrode and its associated rectifying junction. Normally such impurities may be removed by means of an etchant, but it is not practicable to etch the device when it is connected to a relatively large mass of metal. The instant application relates to a technique which may be utilized with surface alloyed semiconductor devices which have electrodes that do not contain indium, such as electrodes consisting of lead or aluminum.

An object of this invention is to provide an improved semiconductor device suitable for power operations.

Another object is to improve heat dissipation in junction-type semiconductor devices.

But another object of this invention is to provide an improved junction transistor having good heat-dissipating characteristics and improved electrical characteristics.

A further object of the invention is to provide an improved method for manufacturing semiconductor devices.

Still another object of the invention is to provide an improved method of bonding a semiconductor device to a heat-dissipating structure.

Yet another object of the invention is to provide an improved connection with low thermal resistance between a power transistor and a heat dissipator.

Another object of the invention is to provide an improved method of mounting semiconductor devices to obtain improved cooling.

These and other objects are accomplished by the instant invention, which provides an improved room-temperature method of making a bond with low thermal resistance between a heat dissipator and a semiconductor device having at least one electrode comprising a material which is incapable of forming a strong bond with indium. In a preferred form of the invention, the method comprises bonding said electrode to one face of a small metal plate. The opposite face of the metal plate bears a layer of indium, or alternatively an indium layer is deposited on this face after the plate has been bonded, for example by soldering, to the electrode. Since the metal plate is relatively small compared to the device, the assembly of device and plate may be immersed in an acid bath and etched to remove the flux and other impurities around the electrode. An indium layer is also deposited on a supporting base, which is preferably a thermally and electrically conductive metallic heat sink and is relatively large compared to the device. The supporting base may, for example, be a block of copper. The indium layers on the metal plate and on the supporting base are then united by pressing one in contact with the other. Preferably fresh flat surfaces are exposed on the indium layers prior to this step, and angular rotation is effected between the device-plate assembly and the supporting base while maintaining the pressure. Since indium is weldable at relatively low temperatures and moderate pressures, molecular attraction causes the two fresh flat indium surfaces to coalesce and disappear. A single layer of indium is thus formed, and the device is thus bonded to the base at room temperature. As the base support is fabricated from thermally and electrically conductive material and the mass of the support is relatively large compared to the mass of the device, the base not only provides mechancial support and electrical contact for the device, but also becomes a heat dissipator for cooling the unit. If desired, forced fluid cooling means may be provided within the heat dissipator.

The invention and its features will be more fully described by the following detailed description, in conjunction with the drawing, wherein.

Similar reference numerals are applied to similar elements throughout the drawing.

Figure 1:
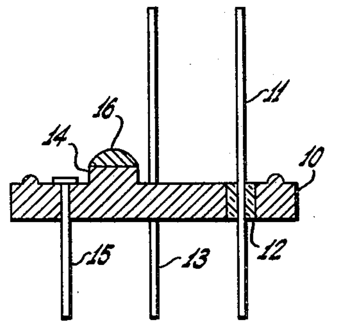
FIGURES 1–7 are sectional elevational views of a semiconductor device including a heat dissipator, showing successive steps in the fabrication of such a device in accordance with a method of this invention.

With reference to FIGURE 1, a supporting base 10 is prepared from material having good thermal and electrical conductivity. The base is essentially a metallic block whose mass is relatively large compared to the transistor, and hence can serve as a heat dissipator. A suitable material for this purpose is oxygen-free, high conductivity copper. The supporting base 10 may be pierced to receive terminal leads or pins. In this example, the support 10 holds a terminal lead or pin 11 in an eyelet 12 of insulating material such as glass or the like. A second terminal lead 13 is held within a similar eyelet (not shown). A third pin 15 is in direct electrical and thermal contact with the base 10. A coating or layer 16 of indium is deposited at the desired site on the upper surface of the base 10. The site may, for example, be the top of a central boss 14. For example, a pellet or disc of indium about 10–15 mils thick may be placed at the predetermined site and the assembly then heated on a hot plate so that the indium melts and is fused to the desired location. Preferably the indium pellet is dipped in a solution of zinc chloride before soldering it to the base. The indium tends to ball up and assume a hemispherical shape.

Figure 2:
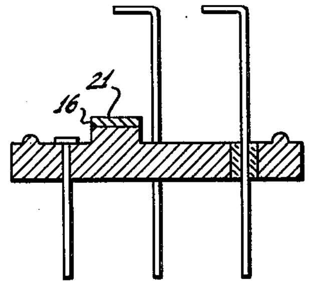

FIGURE 2 shows the support 10 after the indium layer 16, which was originally 10–15 mils thick, has been shaved to a thickness of about 2–4 mils. A fresh indium surface 21 is thus exposed, which is preferably flat and parallel to the upper surface of plate 10. The upper portion of pins 11 and 13 is given a right angle bend at this time.

Figure 3:
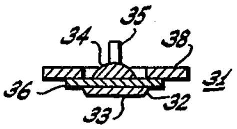
Figures 7, 8, 9, 10:
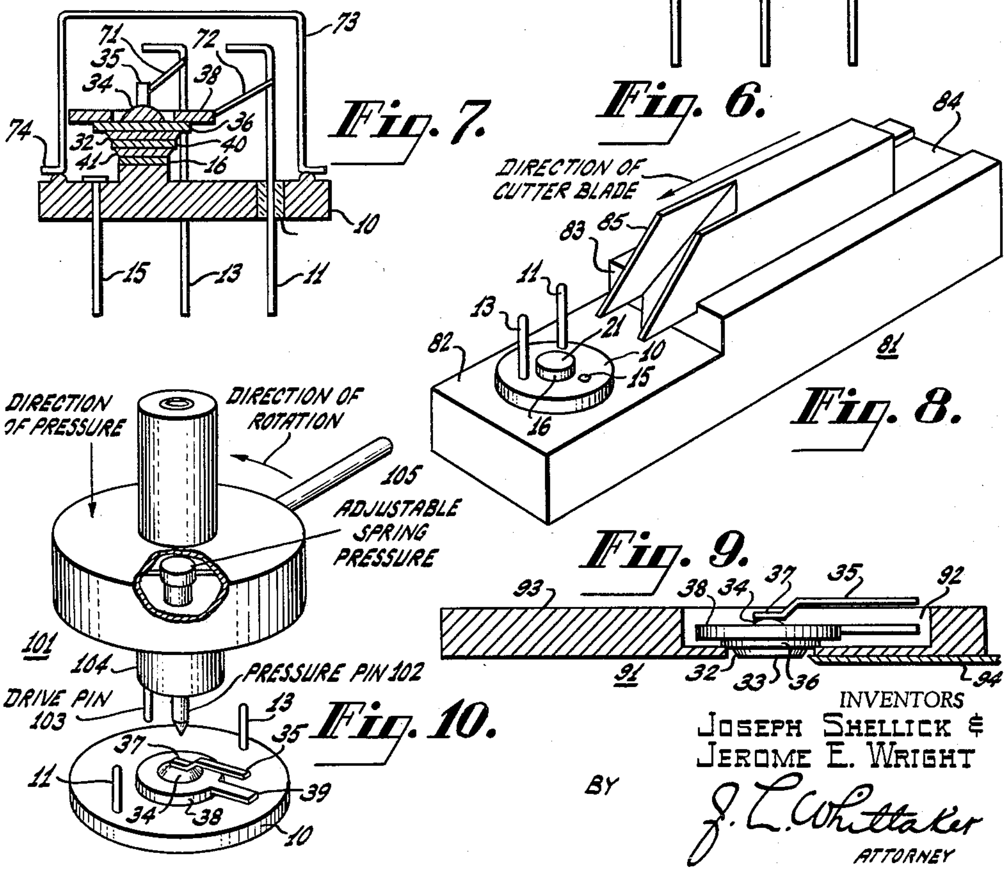
FIGURE 8 is a schematic perspective view of apparatus used to expose a fresh flat surface on an indium coating or layer which has been deposited on a supporting base.
FIGURE 9 is a sectional view of apparatus used to expose a fresh flat surface on an indium-coated metal plate which has been bonded to a junction-type semiconductor device.
FIGURE 10 is a schematic perspective view of apparatus used to impart pressure and relative rotation between the semiconductor device-plate assembly and the supporting base which serves as a heat dissipator.

Referring to FIGURE 3, a junction semiconductor device 31 containing at least one fused electrode 32 is prepared by conventional methods. The incomplete device 31, which still requires mounting, electrical connections, and casing, may be of any type known to the art, such as diodes, triodes, tetrodes and unipolar transistors. In this example, the assembly 31 is a surface alloyed triode transistor such as described generally in a paper by D. A. Jenny entitled "A Germanium NPN Alloy Junction Transistor" in the December 1953 Proceedings of the IRE. The transistor assembly 31 consists of an emitter electrode pellet 34 and a similar collector electrode pellet 32 coaxially alloyed to opposite surfaces of a semiconductor wafer 36. The wafer may consist of germanium, silicon, or the like. In this example, the wafer 36 is P-type germanium, and electrode pellets 33 and 34 are composed of 99% lead-1% arsenic. A metal ring 38, which may for example be nickel, is ohmically soldered to the wafer 36 around the emitter electrode 34. The ring 38 serves as the base tab, and has a tail 39 as shown in perspective in FIGURE 10. An emitter lead 35 has a flattened end 37 soldered over the emitter pellet 34, as shown in FIGURE 9. The collector electrode 32 is shaved to provide a flat surface 33. This may be accomplished as described below in connection with FIGURE 9. The exposed surface 33 of the lead-arsenic electrode 32 should preferably be flat and parallel to the germanium wafer 36.

Figure 4:
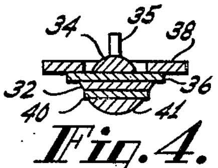

Referring to FIGURE 4, one face of a metal disc 40 is soldered to the flat surface 33 of collector electrode 32. During the same heating cycle an indium pellet 41 is soldered to the opposite face of the metal disc 40. The disc 40 may consist of metals such as nickel, chromium, rhodium, platinum, osmium, iridium, and palladium and alloys of these materials, which exhibit good electrical and thermal conductivity and are relatively inert both with respect to the semiconductor wafer 36 and to subsequent etchants. In this example, the disc 40 consists of nickel. Preferably disc 40 is but little larger than flat surface 33 of the collector electrode 32, and has a mass relatively small compared to device 31.

An important advantage of this invention is that the device may now be etched to remove the excess soldering flux and other impurities which were spread over electrode 32 as a result of the previous soldering of plate 40 to the electrode. These impurities tend to degrade the electrical characteristics of the device in an irregular manner, so that a production run of similar units exhibits poor and variable quality if the impurities are not removed. As explained above, if the device 31 is directly soldered to the metal support 10, whose mass is considerably larger than that of the device, it is impracticable to etch the unit subsequently, since the support will react with large amounts of the etchant unless the former is made of a noble metal. The latter expedient is obviously too expensive for commercial units. However, plate or disc 40 of the instant invention has a mass relatively small compared to the mass of the unit, and hence the entire assembly can now be immersed in an etchant without difficulty. Etching may be performed as desired in either an acid or an alkaline solution by known techniques. Electrical etching may also be utilized. In this example, etching is accomplished by immersing the assembly of unit 31 and plate 40 with indium pellet 41 in a bath consisting of 10% hydrogen peroxide in deionized water for about 30 minutes.

Figure 5:
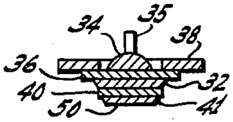

Referring to FIGURE 5, after the unit has been etched the indium pellet 41 on plate 40 is shaved to a thickness of 2–3 mils so as to expose a fresh flat surface 50 which is preferably parallel to the nickel plate 40 and the semiconductor wafer 36.

Figure 6:
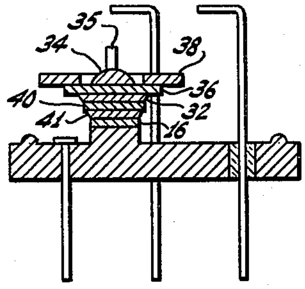

Referring to FIGURE 6, the semiconductor assembly 31 is positioned against the support 10 so that the fresh flat surface 50 of indium layer 41 on nickel plate 40 is in contact with the fresh flat surface 21 of indium layer 16 on support 10. Preferably the exposed surfaces are less than 15 minutes old, since a surface film of oxides and impurities tends to form on indium in air, and clean indium surfaces are desired for the practice of the invention. A pressure of about 3500 to 7000 grams per square inch of exposed electrode surface 33 is applied between the device 31 and the base 10. It is preferred to impart relative angular rotation between base 10 and assembly 31 while maintaining the pressure. Either the base or the assembly may be held fixed while the other is rotated. In this example, the supporting base 10 is held stationary while the assembly 31 is rotated. The exact amount and speed of rotation is not critical. The combination of pressure and rotation of the assembly relative to the base of about 10 to 20 degrees is sufficient to cause the flat surface 21 of the indium layer 16 to coalesce with the flat surface 50 of the indium layer 41. No heat is required in this operation, and a bond having low thermal resistance is thereby formed.

Referring to FIGURE 7, the base tab 38 is electrically connected to pin 11 by welding a conductive wire 72, known as a jumper wire, between pin 11 and base tab 38. The emitter electrode 34 is connected to pin 13 by welding jumper wire 71 between emitter lead 35 and pin 13. External electrical contact to the collector electrode 32 may be achieved by means of pin 15.

The final step is to case the assembly by any convenient method known to the art. In this example, a metallic cap 73 having a turned-out flange 74 is welded to the mounting surface of the base 10 at the flange 74. All the welding steps are sufficiently remote from the semiconductive wafer 36 so as not to have any significant deleterious effects thereon.

The fresh clean flat surface of the indium layer or pellet 16 on base 10 and the indium pellet 41 on plate 40 may be exposed by any convenient method. For example, the indium layer and the indium pellet may be shaved by hand with a razor blade. The assembly may then be manually mounted on the supporting base. However, it is preferred to use apparatus such as shown in FIGURES 8, 9 and 10 for mass production of semiconductor junction devices in accordance with this invention.

Referring to FIGURE 8, the base 10 bearing the indium pellet or disc 16 uppermost is positioned on the work table 82 of the shaving apparatus 81. Positioning is accomplished by inserting pins 11, 13 and 15 into recesses (not shown) in the work table 82. Adjacent the work table 82 of the apparatus is a raised portion 83 containing a slot 84, which holds and directs the cutting tool 85 over the indium disc 16. A single stroke of the cutting tool 85 across the indium disc 16 shaves off the upper portion of the disc 16, leaving a layer of indium about 2–4 mils thick, and exposing an indium surface 21 which is fresh, flat, and parallel to the face of supporting base 10. The same apparatus is used to slice indium pellet 41 on plate 40 of the device, and thus expose an indium surface 50 which is fresh, flat, and parallel to plate 40 and wafer 36.

Referring to FIGURE 9, a flat surface 33 on the lead-arsenic fused electrode 32 of the semiconductor assembly 31 is prepared by means of slicing apparatus 91. The device 31 is pressed in a recess 92 of a pivoted horizontal plate 93. The recess is deep enough to permit a portion of the alloyed electrode 32 to protrude below the layer surface of the pivoted plate 93. A horizontal blade 94 is fixed just below the lower surface of the pivoted plate 93. On swinging the plate 93 against the blade 94, the protruding portion of the collector electrode 32 is sliced away, and a flat surface 33 is thereby exposed.

Referring to FIGURE 10, the apparatus 101 for mounting the semiconductor assembly 31 on the base 10 comprises a spring loaded pressure pin 102, and a drive pin 103, which are held in the lower end of an adjustable, vertically mounted, rotatable metal sleeve 104. The pressure pin 102 is coaxial with the metal sleeve 104, while the drive pin 103 is offset from the axis of sleeve 104. Attached to the sleeve 104 is a horizontal handle 105 which controls the rotation and height of the sleeve. In this example, the spring loaded pressure pin 102 is adjusted to exert a pressure of 5000 grams per square inch. The amount of rotation of the handle 105 is preset by two positive stops. In this example, the handle is preset to rotate approximately 18 degrees. The plate 10 is positioned in the apparatus 81 so that the freshly exposed surface 21 of indium layer 16 is directly below the pressure pin 102. After the fresh flat surface 50 of indium layer 41 on plate 40 of assembly 31 has been exposed in the apparatus shown in FIGURE 8, the assembly 31 is placed on base 10 so that the fresh flat indium surface 50 contacts the fresh surface 21 of the indium layer 16. The sleeve 104 is then lowered, so that the pressure pin 102 is forced against the flat portion 37 of the emitter lead 35. A pressure of about 5000 grams per square inch is thus exerted between the flat indium-covered surface 50 and the flat surface 21 of the indium layer. At the same time, the handle 105 is rotated approximately 18 degrees, This revolves the drive pin 103 against the tail 39 of the base tab 38, and hence causes the assembly 31 to rotate about 18 degrees. A bond is thus formed, in which the fresh surface 50 of indium layer 41 on plate 40 is coalesced with the fresh surface 21 of the indium layer 16 on the base 10. The bond is mechanically strong and has low thermal reseistance.

To provide still further cooling, the heat dissipator 10 may be provided with a continuous channel (not shown), throughout which a fluid cooling means may be circulated during operation of the device.

It will be understood that while the invention has been described by way of example in connection with a power transistor of the triode type, it is by no means limited by such application. Other types of semiconductor assemblies known to the art, and having a greater or smaller number of electrodes and PN junctions, may be similarly treated to provide good thermal dissipation. For example, a single junction semiconductor assembly known as a diode may be prepared by alloying an indium pellet to a surface of a wafer of N-conductivity type germanium. The pellet may then be shaved to expose a fresh flat indium surface, and mounted on a heat dissipating base by the method described above.

Although the invention has been described with reference to a germanium unit, it will be understood that the invention may be practiced with surface alloyed devices in which the semiconductor wafer is composed of other semiconductors such as gallium arsenide, indium phosphide, and the like. For example, the invention may be practiced with surface alloyed silicon devices such as described generally in a paper by H. Nelson entitled "A Silicon N–P–N Junction Transistor by the Alloy Process," Transistors I, published March 1956, by RCA Laboratories, Princeton, New Jersey. It will also be understood that the invention is equally applicable to PNP units, for example units in which the alloyed electrodes consist of aluminum or aluminum alloys.

There has thus been described a novel structure and arrangement for efficiently dissipating heat in power semiconductor devices. The effect is obtained by making bond having low thermal resistance between a device electrode where heat is generated, and a relatively large volume heat dissipator. Measurements indicate that the thermal resistance of the bond made in accordance with this invention is about 4° C. per watt dissipated.

What is claimed is:

1. The method of mounting a semiconductor device including a lead-containing electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of indium on the opposite face of said plate, exposing a fresh flat surface of said indium coating, depositing a layer of indium on a supporting member, exposing a fresh flat surface of said indium layer, contacting said fresh indium surface on said plate to said fresh indium surface on said supporting member, pressing the device-plate assembly to said supporting member, and rotating said device-plate assembly while maintaining pressure between said device-plate assembly and said supporting member to coalesce said indium surfaces.

2. The method of mounting a surface alloyed semiconductor device including at least one fused lead-containing electrode, said electrode being incapable of forming a strong bond with indium, comprising the steps of bonding said electrode directly to one face of a nickel plate, said plate being relatively small compared to said device, depositing a coating of indium on the opposite face of said plate, exposing a fresh flat surface of said indium coating, depositing a layer of indium on a supporting base, exposing a fresh flat surface of said indium layer, and pressing said exposed indium surface on said opposite face of said plate against said exposed indium surface of said base while effecting relative angular rotation between said base and said plate to coalesce said indium surfaces.

3. The method of mounting a semiconductor device including a lead-containing electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of indium on the opposite face of said plate, exposing a fresh flat surface of said indium coating, depositing a layer of indium on a supporting base, exposing a fresh flat surface of said indium layer, positioning the device-plate assembly on said base so as to contact said exposed indium surface on said plate to said exposed indium surface on said base, and pressing said device-plate assembly to said base plate while imparting angular rotation to said device-plate assembly so as to coalesce said indium surfaces.

4. The method of mounting a semiconductor device including a lead-containing electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of indium on the opposite surface of said plate, shaving said coating to expose a fresh flat indium surface, depositing a layer of indium on a supporting base, shaving said layer to expose a fresh flat indium surface, positioning the device-plate assembly on said base so as to contact said fresh indium surfaces, and pressing said device-plate assembly to said base while imparting sufficient angular rotation to said device-plate assembly so as to coalesce said indium surfaces and bond said device-plate assembly to said base.

5. The method of mounting a semiconductor device including a lead-containing electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of indium on the opposite face of said plate, shaving said coating to expose a fresh flat indium surface, depositing a layer of indium on a predetermined portion of a thermally conductive base, shaving said layer to expose a fresh flat indium surface, contacting said exposed indium surface on said plate to said exposed indium surface on said base, and pressing the device-plate assembly to said base while imparting sufficient angular rotation to said device-plate assembly so as to coalesce said indium surfaces and bond said device-plate assembly to said base.

6. The method of mounting a surface alloyed semiconductor device including at least one lead-containing fused electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of indium on the opposite face of said plate, shaving said coating to expose a fresh flat indium surface, depositing an indium layer about 10–15 mils thick on a thermally conductive base, shaving said indium layer to a thickness of about 2–4 mils so as to expose a fresh flat indium surface, contacting said exposed indium surface on said plate to said exposed indium surface on said base, and pressing the device-plate assembly to said base while imparting sufficient angular rotation to said device-plate assembly so as to coalesce said indium surfaces and bond said device-plate assembly to said supporting base.

7. The method of mounting a surface alloyed semiconductor device including at least one fused lead-containing electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of indium on the opposite face of said plate, shaving said coating to expose a fresh flat indium surface, depositing an indium layer about 10–15 mils thick on a thermally conductive base, shaving said layer to a thickness of about 2–4 mils so as to expose a fresh flat indium surface, contacting said exposed indium surface on said plate to said exposed indium surface on said base, pressing the device-plate assembly to said base with a pressure of about 3500 to 7000 grams per square inch of indium surface on said plate, and rotating said device-plate assembly about 10 to 20° while maintaining said pressure so as to coalesce said indium surfaces and bond said device-plate assembly to said base.

8. The method of mounting a surface alloyed semiconductor device including at least one lead-containing fused electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of indium on the opposite face of said plate, shaving said coating to expose a fresh flat indium surface, depositing an indium layer about 10–15 mils thick on a thermally and electrically conductive base, shaving said layer to a thickness of about 2–4 mils so as to expose a fresh flat indium surface, contacting said exposed indium surface on said plate to said exposed indium surface on said base, pressing the device-plate assembly to said base with a pressure of about 5000 grams per square inch of indium surface on said plate, and rotating said device-plate assembly about 18° while maintaining said pressure so as to coalesce said indium surfaces and bond said device-plate assembly to said base.

9. The method of mounting a surface alloyed semiconductor device including at least one lead-containing fused electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a layer of indium on the opposite face of said plate, shaving said layer to expose a fresh flat indium surface, depositing a layer of indium on a supporting base, shaving said indium layer on said base to expose a fresh flat indium surface, and uniting said indium layers by pressing one in contact with the other.

10. The method of making a surface alloyed semiconductor device including at least one lead-containing fused electrode, comprising the steps of bonding said electrode directly to one face of a metal plate, said plate being relatively small compared to said device, said metal being selected from the group consisting of nickel, chromium, rhodium, platinum, osmium, iridium, palladium, and alloys of these metals, depositing a coating of said indium on the opposite face of said plate, shaving said coating to expose a fresh flat indium surface, depositing an indium layer about 10–15 mils thick on a thermally and electrically conductive base, shaving said layer to a thickness of about 2–4 mils so as to expose a fresh flat indium surface, contacting said fresh surface on said plate to said fresh surface on said base within 15 minutes after said surfaces have been exposed, pressing the device-plate assembly to said base with a pressure of about 5000 grams per square inch of indium surface on said plate, and rotating said device-plate assembly about 18° while maintaining said pressure so as to coalesce said fresh indium surfaces and bond said device-plate assembly to said base.

References Cited in the file of this patent

UNITED STATES PATENTS

| | | |
|---|---|---|
| 1,624,501 | Nelson | Apr. 12, 1927 |
| 1,661,448 | Taylor | Mar. 6, 1928 |
| 2,443,870 | Reynolds | June 22, 1948 |
| 2,662,500 | Fort et al. | Dec. 15, 1953 |
| 2,671,746 | Brew | Mar. 9, 1954 |
| 2,707,889 | Sowter | May 10, 1955 |
| 2,731,704 | Spanos | Jan. 24, 1956 |
| 2,754,238 | Arenberg | July 10, 1956 |
| 2,790,656 | Cook | Apr. 30, 1957 |
| 2,820,932 | Looney | Jan. 21, 1958 |
| 2,854,612 | Zaratkiewicz | Sept. 30, 1958 |
| 2,907,935 | Nagorsen | Oct. 6, 1959 |
| 2,984,774 | Race | May 16, 1961 |
| 2,985,550 | Anderson | May 23, 1961 |
| 2,990,502 | Willemse et al. | June 27, 1961 |
| 3,002,271 | Thornton | Oct. 3, 1961 |

OTHER REFERENCES

"Pressure Welding," article in The Welding Journal, August 1951, pp. 728–730.